US006296509B1

(12) United States Patent
Leung et al.

(10) Patent No.: US 6,296,509 B1
(45) Date of Patent: Oct. 2, 2001

(54) INTERCONNECT ENGAGEMENT AND REMOVAL USING A TORQUE-LIMITING SCREW

(75) Inventors: Winnie C. Leung, San Francisco; Kenneth Kitlas, San Jose; Anita Patel, Palo Alto, all of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/340,959

(22) Filed: Jun. 28, 1999

(51) Int. Cl.[7] ................................ H01R 13/627
(52) U.S. Cl. ................ 439/362; 439/327; 439/411; 361/740
(58) Field of Search ................... 439/362, 364, 439/325, 327, 411; 361/684, 686, 730, 733, 785, 788, 796, 797, 740, 741, 726, 881, 882

(56) References Cited

U.S. PATENT DOCUMENTS

| 1,395,592 | 11/1921 | Odom | 464/23 |
|---|---|---|---|
| 2,685,812 | 8/1954 | Dmitroff | 411/7 |
| 3,280,689 | 10/1966 | Rubin | 411/6 |
| 3,289,524 | 12/1966 | Rubin | 411/7 |
| 3,425,314 | 2/1969 | Ohlson | 411/7 |
| 3,504,591 | 4/1970 | Christophersen | 411/6 |
| 3,545,332 | 12/1970 | Tinnerman | 411/6 |
| 3,709,087 | 1/1973 | Stone, Jr. | 411/6 |
| 4,176,582 | 12/1979 | Witte | 411/7 |
| 4,232,356 | * 11/1980 | Saunders et al. | 361/415 |
| 4,258,606 | 3/1981 | Wilson | 411/406 |
| 4,327,610 | 5/1982 | Chiarenza | 81/64 |
| 4,687,392 | 8/1987 | Bidwell | 411/6 |
| 4,859,190 | * 8/1989 | Anderson | 439/78 |
| 5,154,557 | 10/1992 | Houck | 411/7 |
| 5,604,871 | * 2/1997 | Pecone | 395/281 |
| 5,650,917 | * 7/1997 | Hsu | 361/759 |
| 5,779,409 | 7/1998 | Manzolli | 411/7 |
| 5,822,197 | * 10/1998 | Thuault | 361/803 |
| 5,852,547 | * 12/1998 | Kitlas et al. | 361/695 |
| 5,923,531 | * 7/1999 | Bachman et al. | 361/690 |
| 5,966,289 | * 10/1999 | Hastings et al. | 361/704 |

* cited by examiner

*Primary Examiner*—Brian Sircus
*Assistant Examiner*—Son V. Nguyen
(74) *Attorney, Agent, or Firm*—Conley, Rose & Tayon, PC; B. Noël Kivlin

(57) ABSTRACT

A method and apparatus to vertically mount a first printed circuit board into a high-density connector on a second circuit board using one or more torque-limiting screws. A suitable support structure or support surface may be mounted on the second circuit board with the top of the support structure lying below the high-density connector in such a manner as to align the connecting edge on the first circuit board with the longitudinal opening in the high-density connector when the first circuit board is placed on the top surface of the support structure. One or more torque-limiting screws may be mounted on appropriated edges of the first circuit board. One or more grooved channels, preferably equal in number to the torque-limiting screws on the first circuit board, may be provided on the top of the support structure. The torque-limiting screws on the first circuit board are oriented in line with the corresponding grooved channels when the first circuit board is placed on the top of the support structure. The connecting edge on the first circuit board gets inserted into the high-density connector on the second circuit board when the torque-limiting screws are fastened into the grooved channels. The use of one or more torque-limiting screws and a suitable stable support structure may generate a high insertion force over a short insertion distance without overtightening the screws and may also prevent damage to the delicate high-density connecting edge of the first circuit board due to over-insertion. A simple mechanism to insert and remove one circuit board from the other may thus be achieved.

8 Claims, 3 Drawing Sheets

INTERCONNECT ENGAGEMENT AND REMOVAL USING A TORQUE-LIMITING SCREW

BACKGROUND OF THE INVENTION

1. Field of the Invention

The present invention broadly relates to computer systems, and more particularly, to a computer system where one circuit board is vertically mounted on another circuit board using a torque-limiting screw.

2. Description of the Related Art

A computer system generally comprises a number of circuit boards, which carry a large number of electronic components mounted thereon. A motherboard in a computer system is one such typical circuit board. The motherboard carries one or more processors (or "microprocessors") along with a number of memory modules inserted into corresponding sockets provided on the motherboard. A motherboard may further include a number of high density sockets, i.e., sockets having a large number of conducting paths. An external circuit board may be inserted into a high density socket on the motherboard to extend, e.g., memory capacity, of the computer system. The external circuit board may be inserted into the corresponding socket on the motherboard manually with or without further tightening by a screw.

Current screw designs, however, allow a user to "overtighten" a screw such that the user may continue rotating the screw head and advancing the screw even when the two objects to be fastened with the screw are already properly fastened. This overtightening may sometimes result in breakage or damage of one or both of the objects being fastened by the screw. This may not be desirable in certain applications, e.g., where two circuit boards in a computer system are to be fastened, or where the breakage or damage may be expensive or time-consuming to repair. Further, the overtightening may result in blunting of the grooves within the screw receiving surface, which may result in a permanently loose joint unless some additional measures are taken to maintain the screw rigidly fastened. Additionally, a loose screw may fall off the joint during transportation or due to vibrations.

In some applications, a circuit board that is vertically mounted on the motherboard may have a high density connecting edge that requires a high engagement force and a small engagement distance during insertion into a corresponding high density connector socket on the motherboard. It may therefore be desirable to limit the applied torque to prevent overtightening while inserting one circuit board into a socket on another circuit board, e.g., the motherboard, using screw type threaded fasteners.

SUMMARY OF THE INVENTION

The problems outlined above may in large part be solved by utilization of a pair of torque-limiting screws to secure one circuit board into a socket on another circuit board, e.g., a motherboard, in a computer system. The pair of torque-limiting screws may be mounted on a first pair of parallel edges of the circuit board. In one embodiment, the torque-limiting screws are mounted on the circuit board using a pair of brackets.

A support structure comprising a pair of grooved channels may be mounted on the motherboard with the pair of grooved channels remaining perpendicular to the motherboard surface and parallel to the direction of insertion of the circuit board. The support structure may be a flat surface or may be a shroud containing one or more CPU (Central Processing Unit) modules with the top surface of the shroud having the grooved channels on its respective edges. The support structure is mounted on the motherboard in such a way as to have the top of the support structure aligned with the socket (on the motherboard) that receives the circuit board.

Each threaded portion of a corresponding torque-limiting screw on the circuit board is brought in front of a corresponding one of the grooved channels on the support structure. The high density connecting edge of the circuit board is maintained in alignment with the longitudinal opening in the socket on the motherboard. The torque-limiting screws may then be fastened into the corresponding grooves by rotating the heads of the respective torque-limiting screws. The high insertion force provided by the torque-limiting screws facilitates secure engagement of the connecting edge of the circuit board into the longitudinal opening of the high density connector slot on the motherboard.

The transmission of excessive torque to the circuit board, and, hence, extended forward movement of the circuit board connecting edge into the socket on the motherboard is however restricted because of the torque-limiting screws. Because of the prevention of "overtightening", the vertical circuit board may be inserted into the high-density socket on the motherboard without any breakage or damage to the delicate conducting edge of the circuit board.

BRIEF DESCRIPTION OF THE DRAWINGS

A better understanding of the present invention can be obtained when the following detailed description of the preferred embodiment is considered in conjunction with the following drawing, in which.

DETAILED DESCRIPTION OF PREFERRED EMBODIMENTS

Figure 1B:
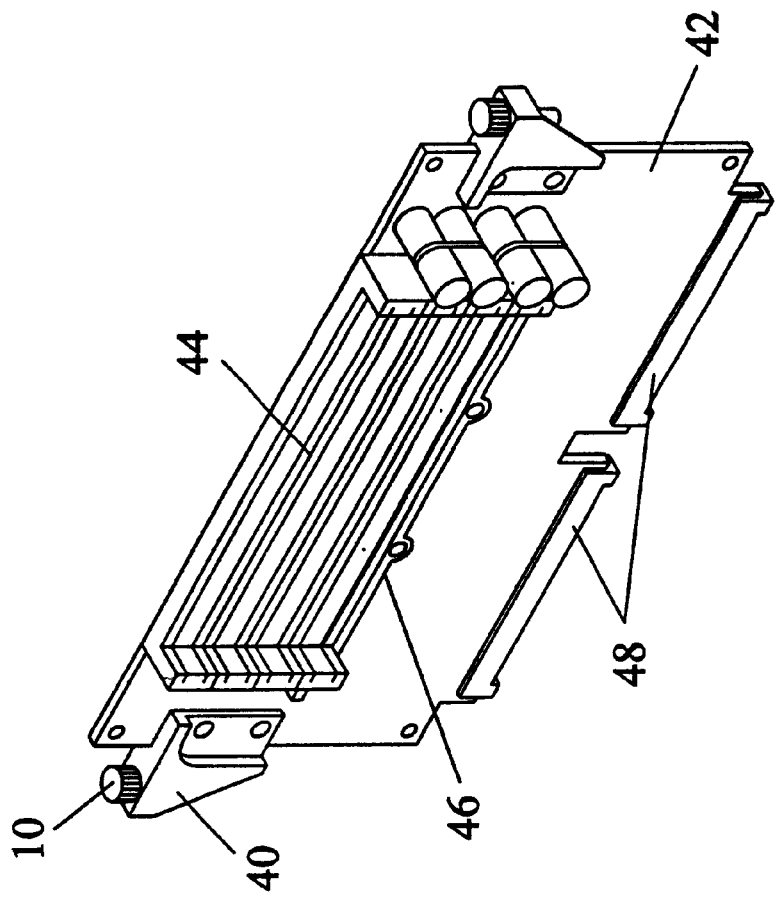
FIG. 1B depicts a memory riser card having a pair of torque-limiting screws mounted thereon.
Figure 1A:
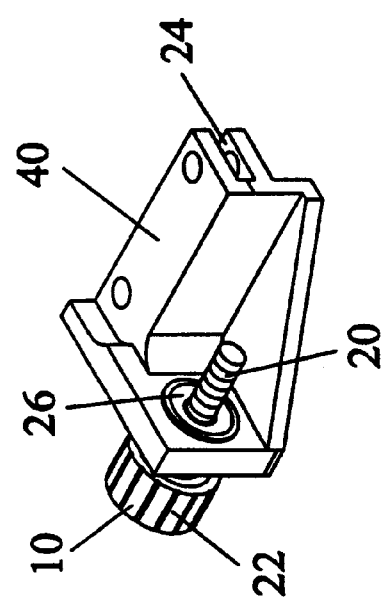
FIG. 1A shows a three-dimensional view of a screw mount carrying a torque-limiting screw.

Referring now to FIG. 1A, a three-dimensional view of a screw mount 40 (alternatively referred to as a "screw bracket") carrying a torque-limiting screw 10 is shown. The torque-limiting screw 10 may generally have a rotatable head portion 22 and a threaded portion 20. The rotation of the head portion 22 in a predetermined direction results in a spiral and linear motion of the threaded portion 20 into a screw receiving surface (e.g., a grooved channel 55 in FIG. 3), thereby fastening the torque-limiting screw 10 against the screw receiving surface. The torque-limiting screw 10 may be made of metal, plastic or any suitable material depending on the desired application. Further, different parts of the torque-limiting screw may be made of different materials. For example, the head portion 22 may be made of a plastic material whereas the threaded portion 20 may be of stainless steel or of aluminum or of sheet metal.

Similarly, the screw mount 40 may be made of a number of different materials depending on such factors as weight, stiffness, cost, etc. In the preferred embodiment, the screw bracket 40 is made of plastic. A plastic screw mount 40 may provide a light-weight, yet rigid, mounting means for the torque-limiting screw 10. A rectangular notch or opening 24 may be provided along a surface of the screw mount 40 to allow the screw mount to slide along a mounting edge of a circuit board as shown in the disassembled view in FIG. 2. The torque-limiting screw may be inserted through a screw opening 26 in the screw bracket 40 as illustrated.

FIG. 1B depicts a memory riser card 42 having a pair of torque-limiting screws 10 mounted thereon through a corresponding pair of screw brackets 40. In one embodiment, the torque-limiting screws 10 may be mounted along the edges of the riser card 42 without the screw mounts 40, but with a similar arrangement that allows easy tightening of the torque-limiting screws. The memory riser card 42 is a vertically mounted printed circuit board (or, a "circuit board") that may be inserted into a socket on another circuit board in a computer system (e.g., a motherboard 50 in FIG. 3) to expand the memory capacity of the system. The riser card 42 may contain a number of connector slots 44 to receive additional memory modules therein.

A stiffener bar 46 (more clearly shown in FIG. 2) may also be mounted at the bottom of the memory connector slots 44 to maintain tighter tolerances on the riser card surface in the vicinity of the connectors 44. The stiffener 46 may maintain the connector slots 44 substantially stretched so as to allow proper electrical connections between a connector slot and a memory module (not shown) inserted therein. Breakage of riser card surface in the vicinity of the connectors 44 due to bending or sagging may also be prevented through the support provided by the stiffener bar 46.

The memory riser card 42 may be mounted, for example, on a motherboard through insertion of its connecting edge 48 into a corresponding high density connector socket on the motherboard. The connecting edge 48 may be a single continuous edge or may comprised of two parts as in FIG. 1B. The connecting edge 48 may have a high density of conducting members or conductors thereon. Preferably, the conducting edge 48 may have dual in-line conductors placed on either side thereof. The high density of conducting paths over a thin layer of connecting edge 48 may require careful insertion of the riser card 42 into a socket on the motherboard. As discussed later, the torque-limiting screws on the riser card provide sufficient insertion force without overtightening the riser card once the riser card is securely inserted into the corresponding motherboard socket.

Figure 2:
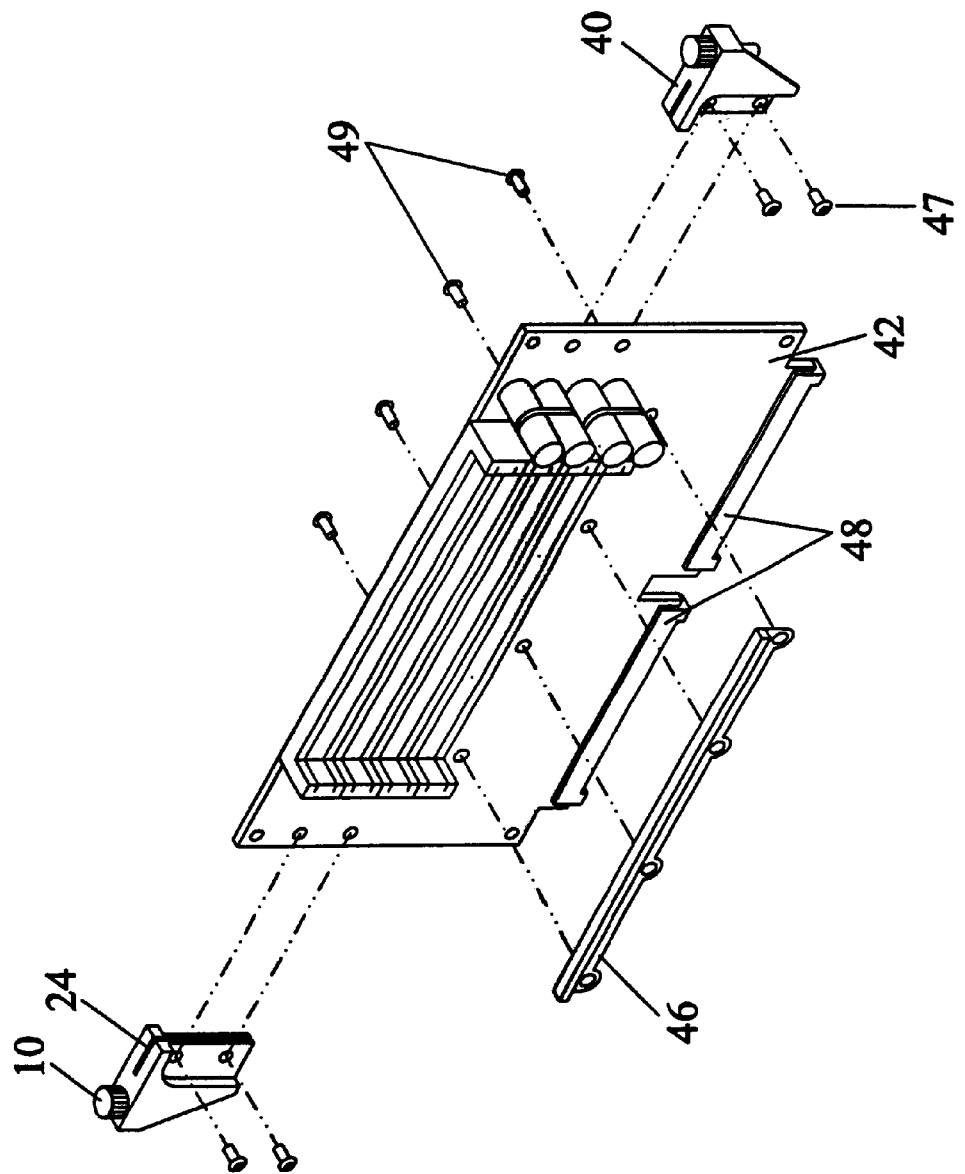
FIG. 2 illustrates in a perspective view the mounting of various components on a memory riser card.

Turning now to FIG. 2, the memory riser card 42 is shown in a perspective view along with a number of components prior to being mounted on the riser card 42. Some principal components include the pair of torque-limiting screws 10 and corresponding screw mounts 40 and the stiffener bar 46. As illustrated in FIG. 2, each screw bracket 40 may be securely attached to the memory riser card 42 with a pair of bracket screws 47. In different embodiments, more or less than two bracket screws 47 may be needed to mount the corresponding bracket 40. The size of the screw bracket 40, the number of screw receiving holes within the bracket 40 and on the riser card 42, the weight of the material used for the screw bracket 40, etc. may affect the number of bracket screws 47 that may be needed to securely attach the bracket 40 to the riser card edge.

Similarly, the stiffener bar 46 may also be tightly attached to the memory riser card 42 using a number of (here, four) locking or lock-tight screws 49. The locking screws 49 may be spaced equally along the length of the stiffener 46. In one embodiment, the twisting of the locking screws 49 in a predetermined direction may lock them in a particular position until twisted in the opposite direction. The bracket screws 47 and the locking screws 49 both allow easy attachment and removal of the screw mounts 40 and the stiffener 46 respectively from the riser card 42 surface.

It is noted that the torque-limiting screws 10 may be designed in various ways. Two examples of torque-limiting screw designs may include the configurations illustrated in the U.S. Pat. No. 4,687,392 (issued on Aug. 18, 1987) and in the U.S. Pat. No. 3,709,087 (issued on Jan. 9, 1973).

Figure 3:
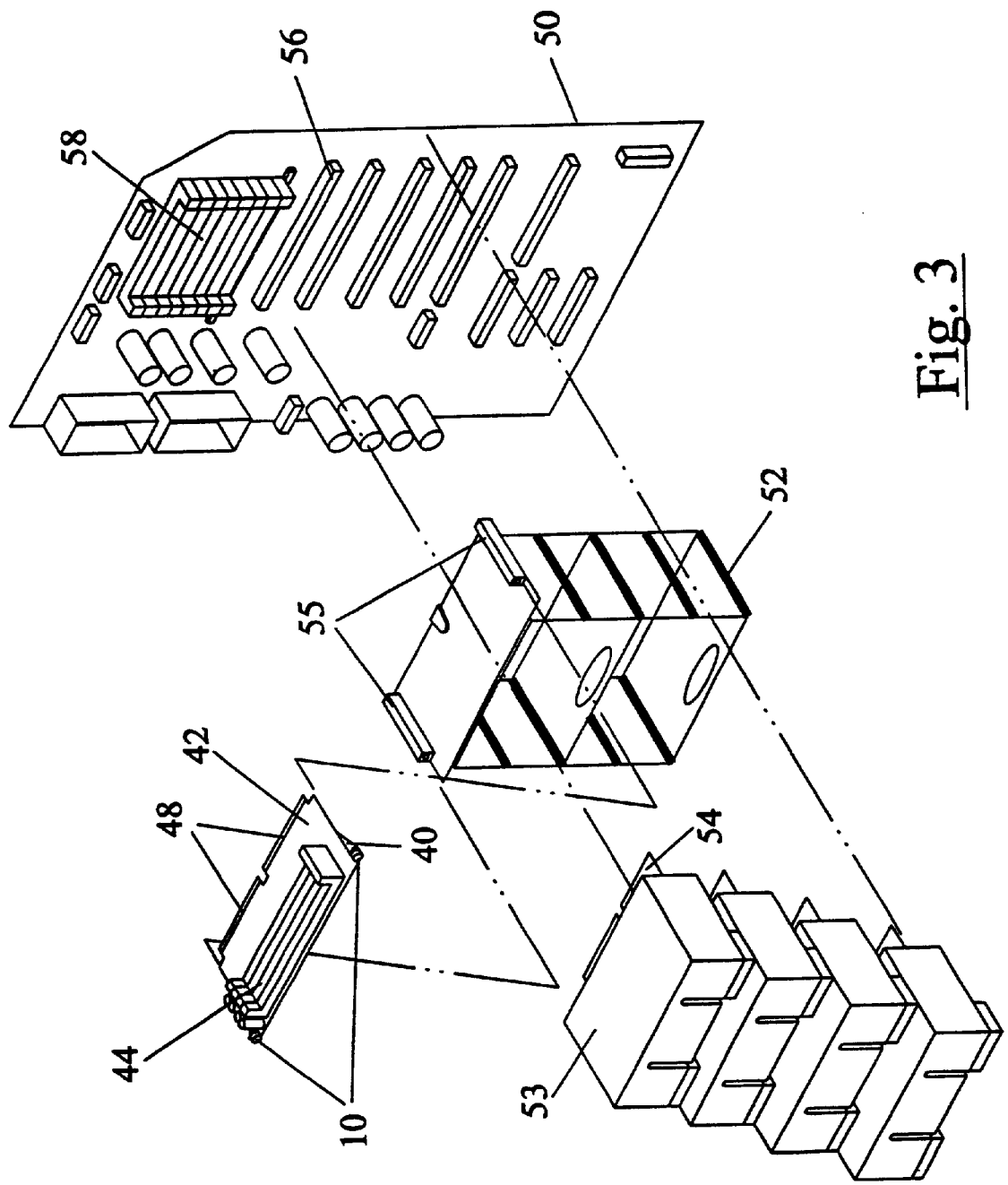
FIG. 3 shows an exemplary arrangement whereby a vertical memory riser card is mounted on a motherboard using a pair of torque-limiting screws.

Referring now to FIG. 3, an arrangement whereby a vertical printed circuit board (PCB) (here, the memory riser card 42) is mounted on another circuit board (here, the motherboard 50) is illustrated. The motherboard 50 may include a number of memory sockets 58 for the system memory. Additional memory capacity may be provided through external memory board, e.g., the riser card 42. The motherboard 50 may also include some PCI (peripheral component interconnect) cards (e.g., a graphics card) (not shown), one or more power supply modules (not shown), and numerous other electronic circuit elements. A number of high-density connector slots 56 on the motherboard 50 may allow insertion of various vertical PCB's therein. The memory riser card 42 is one such vertical PCB that may be inserted into its corresponding motherboard connector slot 56 through a back-plane support structure.

In a preferred embodiment, the support structure is a CPU shroud 52 that houses one or more CPU modules 53. A CPU module 53 may either contain a CPU logic card 54 or may be empty. The CPU logic card 54 may include one or more CPU's and associated processing circuitry. Each CPU logic card 54 may be inserted into its corresponding socket on the motherboard 50 when the shroud 52 is mounted on the motherboard and when the respective CPU module 53 is placed inside the shroud 52. The stacking of CPU modules inside the shroud 52 may allow for ease of insertion and removal of individual CPU logic cards during fabrication and maintenance of the computer system.

The top of the shroud 52 may serve as a platform which is aligned with the motherboard connector 56 receiving the memory riser card 42. A screw receiving surface, e.g., two grooved channels 55, may be provided on the top of the shroud 52 to allow screwing of corresponding torque-limiting screws 10 therein. A grooved channel 55 may be a hollow cylinder with grooves formed therein and having at least the same length as that of the threaded portion 20 of the corresponding torque-limiting screw to be fastened therein as described later. In the absence of the shroud 52, any other suitable flat support surface with one or more grooved channels 55 (depending on the number of torque-limiting screws 10 on the riser card 42) may be provided to rest below the riser card 42 on the motherboard 50 and to facilitate insertion of the riser card into a corresponding high-density connector 56 by aligning the riser card 42 with the connector 56.

The memory riser card 42 may first be placed on the top of the support structure (here, the CPU shroud 52), which is already mounted on the motherboard 50 near the appropriate high-density connector 56. The top of the shroud 52 may be slightly wider to accommodate the memory riser card 42 along with the screw-mounted brackets 40. Each torque-limiting screw 10 may then be aligned with the corresponding grooved channel 55 on the support surface of the shroud 52. The threads on each threaded portion 20 may partially enter into the corresponding grooved channel 55 when the torque-limiting screws 10 are brought closer to the grooved channels 55 by sliding the riser card 42 forward along the top of the shroud 52. The two-part connecting edge 48 of the riser card 42 may not yet be in secure engagement with the respective motherboard connector 56.

Once the torque-limiting screws 10 are in line with their corresponding grooved channels 55, a user may simply rotate the head portions 22 in one direction, e.g., the clockwise direction, to exert a high insertion or engagement force (e.g., over hundred pounds) required by the high-density connectors 56 on the motherboard 50, and directly in line with the longitudinal opening in the corresponding motherboard connector 56. Further, the brackets 40, the torque-limiting screws 10 and the placement of the grooved channels 55 vis-a-vis the brackets 40 may be designed in such a way as to restrict further winding of the torque-limiting screws 10 once the connecting edge 48 on the riser card 42 is inserted a small distance, e.g., 0.027 inches, into the motherboard connector 56. Thus, a simple twist of the head portions 22 of the torque-limiting screws 10 may result in generation of high engagement forces over a small engagement distance to securely engage the connecting edge 48 into the longitudinal opening in the corresponding motherboard connector 56.

The application of torque-limiting screws to insert the riser card 42 may ensure that the dual in-line connectors on the connecting edge 48 are securely engaged into the corresponding motherboard connector 56, and not overtightened. The screw assembly (i.e., the torque-limiting screw 10 and its bracket 40) may have built-in mechanical float so that the alignment of the riser card 42 may be dependent only on the lead-in provided by the connecting edge 48. In other words, before the torque-limiting screws 10 are twisted, the screw mounts 40 and the grooved channels 55 may align the connecting edge 48 in front of the corresponding connector 56 in such a way as to require a small forward movement of the connecting edge 48 to reliably engage the connecting edge 48 into the longitudinal opening in the corresponding connector 56.

The connecting edge 48 and its corresponding connector 56 may have a large number of conducting paths (e.g., a couple of hundred conducting paths). This high-density of conductors over a short length of the connecting edge 48 or the connector 56 may require careful insertion of the riser card 42 to prevent breakage or cracks along the respective conductors. By limiting the torque transmitted to the threaded portion 20 and, hence, by preventing respective threaded portions 20 from further moving spirally and linearly within the corresponding grooved channels 55, the torque-limiting screws 10 allow insertion of the memory riser card 42 without overtightening the connecting edge 48 into its corresponding motherboard connector 56, thereby preventing breakage or cracks on the conducting edge 48. The use of torque-limiting screws 10 may also prevent over-insertion of the connecting edge 48 into its corresponding connector 56. The torque-limiting screws 10 may thus allow easy removal of the riser card 42 when the corresponding head portions 22 are twisted in the reverse direction (here, the counter-clockwise direction).

The foregoing discloses an apparatus and method to securely engage a vertical printed circuit board into a high-density connector on another circuit board without overinsertion. The use of one or more torque-limiting screws and a suitable stable support structure may generate a high insertion force over a short insertion distance without overtightening the torque-limiting screws and may also prevent damage to the delicate a high-density connecting edge of the vertical PCB due to over-insertion. A simple mechanism to insert and remove one circuit board from the other may thus be achieved.

While the invention is susceptible of various modifications and alternative forms, specific embodiment thereof is shown by way of example in the drawing and is herein described in detail. It should be understood, however, that the drawing and detailed description thereto are not intended to limit the invention to the particular forms disclosed, but on the contrary, the intention is to cover all such modifications, equivalents and alternatives as falling within the spirit and scope of the present invention as defined by the appended claims.

What is claimed is:

1. A motherboard assembly comprising:
   a motherboard, wherein said motherboard includes:
      a first socket mounted thereon, wherein said first socket has a longitudinal opening therein;
   a circuit board, wherein said circuit board comprises:
      a connector, wherein said connector is configured to be inserted into said longitudinal opening in said first socket, said connector formed on one of a first pair of parallel edges of said circuit board;
   a pair of torque-limiting screws, wherein each torque-limiting screw is mounted along a respective one of a second pair of parallel edges of said circuit board, and wherein said circuit board is secured to said first socket by said pair of torque-limiting screws; and
   a support structure mounted on said motherboard, wherein the support structure is configured to house a central processing unit (CPU) module connected to the motherboard, wherein a top of said support structure is aligned with said first socket, and wherein said top of said support structure includes:
      a pair of grooved channels, wherein each grooved channel is formed along a respective one of a first pair of parallel edges on the top of said support structure, and wherein the grooved channels remain substantially perpendicular to said longitudinal opening upon alignment of said top of said support structure with said first socket;
   wherein said connector is inserted into said longitudinal opening via screwing of said each of said pair of torque-limiting screws into a corresponding one of said pair of grooved channels.

2. The motherboard assembly as in claim 1, wherein said connector is dual in-line.

3. The motherboard assembly as in claim 1, wherein at least one of said pair of torque-limiting screws is mounted on said circuit board.

4. The motherboard assembly as in claim 1, further comprising:
   a pair of brackets, wherein each of said pair of brackets is mounted on said respective one of said second pair of parallel edges of said circuit board, and wherein said each of said pair of brackets includes:
      a screw opening, wherein said each of said pair of torque-limiting screws is inserted into said screw opening in corresponding one of said pair of brackets.

5. The motherboard assembly as in claim 1, wherein said each of said pair of torque-limiting screws comprises:

a threaded portion, wherein said threaded portion is configured to engage into said corresponding one of said pair of grooved channels upon screwing of respective torque-limiting screw from said pair of torque-limiting screws.

6. The circuit board assembly of claim 1, wherein the circuit board comprises a memory module riser.

7. The circuit board assembly of claim 1, wherein the pair of torque-limiting screws inhibit overtightening of the circuit board to the motherboard.

8. The circuit board assembly of claim 1, wherein the circuit board further comprises a stiffener.

\* \* \* \* \*